US009786228B2

(12) United States Patent
Ma

(10) Patent No.: US 9,786,228 B2
(45) Date of Patent: Oct. 10, 2017

(54) SHIFT REGISTER UNIT AND CONTROL METHOD THEREOF, GATE DRIVING CIRCUIT, AND DISPLAY DEVICE

(71) Applicant: BOE TECHNOLOGY GROUP CO., LTD., Beijing (CN)

(72) Inventor: Zhanjie Ma, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/321,035

(22) PCT Filed: May 20, 2016

(86) PCT No.: PCT/CN2016/082743
§ 371 (c)(1),
(2) Date: Dec. 21, 2016

(87) PCT Pub. No.: WO2016/188367
PCT Pub. Date: Dec. 1, 2016

(65) Prior Publication Data
US 2017/0200419 A1 Jul. 13, 2017

(30) Foreign Application Priority Data

May 22, 2015 (CN) .......................... 2015 1 0266842

(51) Int. Cl.
G09G 3/3266 (2016.01)
G11C 19/28 (2006.01)
(52) U.S. Cl.
CPC ........... *G09G 3/3266* (2013.01); *G11C 19/28* (2013.01); *G09G 2300/043* (2013.01); *G09G 2300/0809* (2013.01); *G09G 2310/0286* (2013.01)

(58) Field of Classification Search
CPC ......... G09G 3/3266; G09G 2300/0809; G09G 2310/0286; G09G 2300/043; G11C 19/28;
(Continued)

(56) References Cited

U.S. PATENT DOCUMENTS

2014/0043222 A1* 2/2014 Han ..................... G09G 3/3677
345/100
2014/0118237 A1* 5/2014 Wang .................... G11C 19/28
345/100
2014/0133621 A1* 5/2014 Shang ................... G11C 19/28
377/67

FOREIGN PATENT DOCUMENTS

CN 1959848 A 5/2007
CN 104282288 A 1/2015
(Continued)

OTHER PUBLICATIONS

International Search Report and Written Opinion mailed Aug. 10, 2016; PCT/CN2016/082743.

Primary Examiner — Premal Patel
(74) Attorney, Agent, or Firm — Ladas & Parry LLP; Loren K. Thompson

(57) ABSTRACT

A shift register unit and a control method thereof, a gate driving circuit, and a display device. The shift register unit includes a signal input module, connected to a signal input terminal, a first clock signal terminal and a control node; a pull-down module, connected to the control node, a first voltage terminal and a signal output terminal; a first pull-up control module, connected to the control node, the pull-up module and a second voltage terminal; a second pull-up control module, connected to the control node, the pull-up module, the first clock signal terminal, the first voltage terminal and a second clock signal terminal; and a pull-up module, connected to the signal output terminal and the second voltage terminal. The problem that it is difficult to
(Continued)

realize a narrow display frame by the bonding process due to size increase of the driving circuit can be solved.

20 Claims, 7 Drawing Sheets

(58) Field of Classification Search
CPC ....... G11C 19/287; G11C 19/38; G11C 27/04; G11C 29/20
See application file for complete search history.

(56) References Cited

FOREIGN PATENT DOCUMENTS

| | | |
|---|---|---|
| CN | 104361860 A | 2/2015 |
| CN | 104537979 A | 4/2015 |
| CN | 104835450 A | 8/2015 |
| EP | 1763003 A2 | 3/2007 |

* cited by examiner

SHIFT REGISTER UNIT AND CONTROL METHOD THEREOF, GATE DRIVING CIRCUIT, AND DISPLAY DEVICE

TECHNICAL FIELD

The present disclosure relates to the field of displaying technique, and more particularly to a shift register unit and a control method thereof, a gate driving circuit, and a display device.

BACKGROUND

The light-emitting principle of an OLED (Organic Light Emitting Diode) device is that, by means of applying a certain electric field to an anode and a cathode on two sides of an electroluminescent layer, electrons and holes, as being driven by the electric field, migrate to a luminescent layer from the cathode and the anode through an electron transport layer and a hole transport layer, respectively, and meet in the luminescent layer to form excitons and to convert light emitting molecules from the ground state to the excited state, which emits visible light through a radiation relaxation process. Compared with the conventional LCD (Liquid Crystal Display), an OLED display is increasingly applied in the field of high-performance displaying due to its characteristics such as self-luminescence, fast response, wide viewing angle, and capability of being fabricated on a flexible substrate.

When the display device described above performs displaying, it is possible to activate by inputting a square wave with a certain width to each row of pixels in sequence from the top to the bottom (or from the bottom to the top) through gate lines, and input a data signal for displaying to the pixels connected to the above activated gate lines through data lines.

In the prior art, in order to reduce manufacturing cost, a GOA (Gate Driver on Array) design may be adopted to integrate a TFT (Thin Film Transistor) gate switch circuit on an array substrate of an LCD display panel, so as to activate the gate lines on the array substrate.

However, since the OLED device is a current-type light-emitting device, when the OLED device performs displaying, the TFTs (Thin Film Transistor) connected to the activated gate lines in the pixel circuit need to maintain a turned-on state for a long time, so that a signal inputted by the data lines can be written into a driving transistor of the pixel circuit, and the OLED device is caused to emit light under driving of the driving transistor. Compared with the OLED display device, a backlight module of the LCD display can always provide a backlight source for displaying, thus the gate lines on the array substrate of the LCD display do not need to maintain an activated state for a long time. Accordingly, the GOA circuit integrated on the LCD display panel cannot be directly applied to the OLED display.

SUMMARY

The embodiments of the present disclosure provide a shift register unit and a control method thereof, a gate driving circuit, and a display device, the gate driving circuit is integrated on the OLED display panel as a GOA circuit. A pulse width of an output signal at a signal output terminal of the shift register unit can be controlled by controlling a pulse width of an input signal at a signal input terminal of the shift register unit, so that the enabling time of the activated gate lines can be controlled.

According to an aspect of the embodiments of the present disclosure, there is provided a shift register unit, comprising a signal input module, a pull-down module, a pull-up module, a first pull-up control module and a second pull-up control module; the signal input module being connected to a signal input terminal, a first clock signal terminal and a control node, respectively, and configured to be enabled under control of the first clock signal terminal so as to output a signal of the signal input terminal to the control node; the pull-down module being connected to the control node, a first voltage terminal and a signal output terminal, respectively, and configured to output a signal of the first voltage terminal to the signal output terminal under control of the control node, store a voltage level of the control node in a state where the signal input module is enabled, and maintain a voltage level of the control node in a state where the signal input module is disabled; the first pull-up control module being connected to the control node, the pull-up module and a second voltage terminal, respectively, and configured to output a signal of the second voltage terminal, as a disabling signal, to the pull-up module under control of the control node; the second pull-up control module being connected to the control node, the pull-up module, the first clock signal terminal, the first voltage terminal and a second clock signal terminal, respectively, and configured to output the signal of the first voltage terminal, as an enabling signal, to the pull-up module under control of the control node, the first clock signal terminal and the second clock signal terminal; and the pull-up module being further connected to the signal output terminal and the second voltage terminal, and configured to be in a disabled state under control of the disabling signal outputted by the first pull-up control module or be in an enabled state under control of the enabling signal outputted by the second pull-up control module so as to output the signal of the second voltage terminal to the signal output terminal.

According to the embodiments of the present disclosure, the first pull-up control module outputs the disabling signal during a first time period, the second pull-up control module outputs the enabling signal during a second time period, the first time period and the second time period do not overlap with each other, the pull-up module is in a disabled state during the first time period, whereas the pull-up module is in an enabled state and outputs the signal of the second voltage terminal to the signal output terminal during the second time period.

According to another aspect of the embodiments of the present disclosure, there is provided a gate driving circuit, comprising any of the shift register unit described above and cascaded in at least two stages, wherein a signal input terminal of the shift register unit in a first stage is connected to a trigger signal terminal; except the shift register unit in the first stage, a signal input terminal of the shift register unit in each of the rest stages is connected to a signal output terminal of the shift register unit in an adjacently upper stage.

According to yet another aspect of the embodiments of the present disclosure, there is provided a display device, comprising any of the gate driving circuit described above.

According to yet another aspect of the embodiments of the present disclosure, there is provided a driving method for driving any of the shift register unit described above, comprising that: a trigger signal is inputted to the signal input terminal, the signal input module is enabled under control of the first clock control terminal to transmit the trigger signal to the control node, so that the pull-down module is disabled and the first pull-up control module is disabled, the pull-down module stores a voltage level of the control node, the second pull-up control module does not output an enabling signal to the pull-up module under control of the second clock control terminal, the pull-up module is disabled, the signal output terminal outputs a non-scanning signal; a trigger signal is inputted to the signal input terminal, the signal input module is disabled under control of the first clock control terminal, the pull-down module maintains a voltage level of the control node, so that the pull-down module is disabled and the first pull-up control module is disabled, the second pull-up control module outputs an enabling signal to the pull-up module under control of the second clock control terminal, so that the pull-up module is enabled, the signal output terminal outputs a scanning signal; a trigger signal is inputted to the signal input terminal, the signal input module is enabled under control of the first clock control terminal to transmit the scanning signal to the control node, so that the pull-down module is disabled and the first pull-up control module is disabled, the pull-down module stores a voltage level of the control node, the output terminal of the second pull-up control module continues to output an enabling signal under control of the second clock control terminal, so that the pull-up module maintains being enabled, the signal output terminal outputs a scanning signal; a non-trigger signal is inputted to the signal input terminal, the signal input module is disabled under control of the first clock control terminal, the pull-down module maintains a voltage level of the control node, so that the pull-down module is disabled and the first pull-up control module is disabled, the second pull-up control module outputs an enabling signal to the pull-up module under control of the second clock control terminal, so that the pull-up module is enabled, the signal output terminal outputs a scanning signal; a non-trigger signal is inputted to the signal input terminal, the signal input module is enabled under control of the first clock control terminal to transmit the non-trigger signal to the control node, so that the pull-down module is enabled and the first pull-up control module is enabled, the pull-down module stores a voltage level of the control node, the first pull-up control module outputs a disabling signal to the pull-up module, the second pull-up control module does not output an enabling signal to the pull-up module under control of the second clock control terminal, the pull-up module is disabled, the signal output terminal outputs a non-scanning signal; and a non-trigger signal is inputted to the signal input terminal, the signal input module is disabled under control of the first clock control terminal, the pull-down module maintains a voltage level of the control node, so that the pull-down module is enabled and the first pull-up control module is enabled, the first pull-up control module outputs a disabling signal to the pull-up module, the second pull-up control module does not output an enabling signal to the pull-up module under control of the second clock control terminal, the pull-up module is disabled, the signal output terminal outputs a non-scanning signal.

In this way, in an output phase of the shift register unit, the shift register unit can enable the pull-up module through the second pull-up control module under control the first clock signal terminal, the second clock signal terminal and the control node, so as to output the signal of the second voltage terminal to the signal output terminal. In addition, a pulse width of an output signal at a signal output terminal of the shift register unit can be controlled by means of controlling a pulse width of a signal at a signal input terminal of the shift register unit, so that the enabling time of the activated gate lines can be controlled, as a result, when the OLED display performs displaying, the TFTs connected to the activated gate lines in the pixel circuit maintain a turned-on state for a long time, so as to achieve self-luminous displaying. In addition, in a non-output phase of the shift register unit, on one hand, the first pull-up control module may be enabled under control of the control node, so that the signal inputted to the second voltage terminal disables the pull-up module, which prevents the signal of the second voltage terminal from being outputted by the pull-up module to the signal output terminal; on the other hand, the signal of the signal input terminal can be transmitted to the control node through the signal input module, and the pull-down module can be enabled under control of the control node, so that the voltage inputted to the first voltage terminal is transmitted to the signal output terminal, so as to pull down the signal output terminal, which avoids activating the gate line connected to the shift register unit in the non-output phase of the shift register unit.

BRIEF DESCRIPTION OF THE DRAWINGS

In order to more clearly illustrate the technical solutions in the embodiments of the present disclosure or in the prior art, drawings necessary for describing the embodiments or the prior art will be briefly introduced below, obviously, the following drawings are only parts of embodiments of the present disclosure, and for those of ordinary skill in the art, it is possible to obtain other drawings based on these drawings without paying creative efforts.

DETAILED DESCRIPTION OF THE EMBODIMENTS

Hereinafter, the technical solutions in the embodiments of the present disclosure will be described clearly and comprehensively in combination with the drawings in the embodiments of the present disclosure, obviously, these described embodiments are only parts of the embodiments of the disclosure, rather than all of the embodiments thereof. All the other embodiments obtained by those of ordinary skill in the art based on the embodiments of the present disclosure without paying creative efforts fall into the protection scope of the present disclosure.

Figure 1:
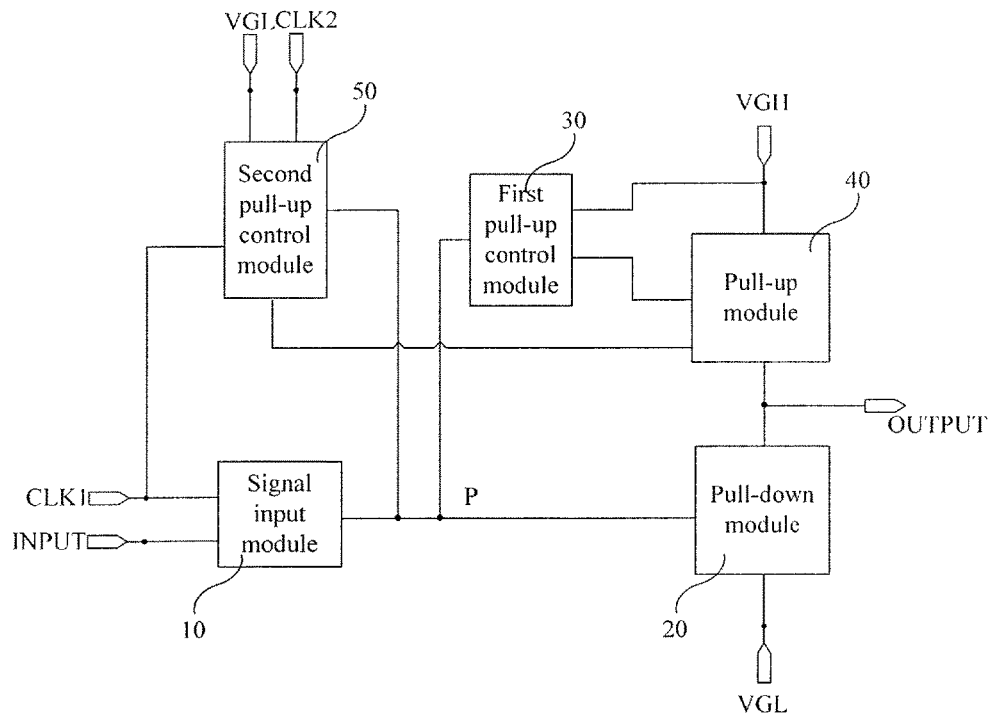
FIG. 1 is a schematic diagram of structure of the shift register unit provided by an embodiment of the present disclosure.

An embodiment of the present disclosure provides a shift register unit, comprising a signal input module 10, a pull-down module 20, a pull-up module 40, a first pull-up control module 30 and a second pull-up control module 50, as shown in FIG. 1.

The signal input module 10 may be connected to a signal input terminal INPUT, a first clock signal terminal CLK1 and a control node P, respectively, and configured to be enabled under control of the first clock signal terminal CLK1 so as to output a signal of the signal input terminal INPUT to the control node P.

The pull-down module 20 may be connected to the control node P, a first voltage terminal VGL and a signal output terminal OUTPUT, respectively, and configured to output a signal of the first voltage terminal VGL to the signal output terminal OUTPUT under control of the control node P, store a voltage level of the control node P in a state where the signal input module is enabled, and maintain a voltage level of the control node P in a state where the signal input module is disabled.

The first pull-up control module 30 may be connected to the control node P, the pull-up module 40 and a second voltage terminal VGH, respectively, and configured to output a signal of the second voltage terminal VGH, as a disabling signal, to the pull-up module 40 under control of the control node P.

The second pull-up control module 50 may be connected to the control node P, the pull-up module 40, the first clock signal terminal CLK1, the first voltage terminal VGL and a second clock signal terminal CLK2, respectively, and configured to output the signal of the first voltage terminal VGL, as an enabling signal, to the pull-up module 40 under control of the control node P, the first clock signal terminal CLK1 and the second clock signal terminal CLK2.

The pull-up module 40 is further connected to the signal output terminal OUTPUT and the second voltage terminal VGH, and configured to be in a disabled state under control of the disabling signal outputted by the first pull-up control module 30 or be in an enabled state under control of the enabling signal outputted by the second pull-up control module 50 so as to output the signal of the second voltage terminal VGH to the signal output terminal OUTPUT.

The first pull-up control module 30 outputs the disabling signal during a first time period, the second pull-up control module 50 outputs the enabling signal during a second time period, the first time period and the second time period do not overlap with each other.

The first pull-up control module 30 is connected to a first control terminal of the pull-up module 40, the second pull-up control module 50 is connected to a second control terminal of the pull-up module 40, the first control terminal and the second control terminal are the same or different.

In this way, in an output phase of the shift register unit, the shift register unit can enable the pull-up module through the second pull-up control module under control the first clock signal terminal, the second clock signal terminal and the control node, so as to output the signal of the second voltage terminal to the signal output terminal. In addition, a pulse width of an output signal at a signal output terminal of the shift register unit can be controlled by means of controlling a pulse width of a signal at signal input terminal of the shift register unit, so that the enabling time of the activated gate lines can be controlled, as a result, when a current-type display, such as the OLED display, performs displaying, the TFTs connected to the activated gate lines in the pixel circuit maintain a turned-on state for a long time, so as to achieve self-luminous displaying. In addition, in a non-output phase of the shift register unit, on one hand, the first pull-up control module may be enabled under control of the control node, so that the signal inputted to the second voltage terminal disables the pull-up module, which prevents the signal of the second voltage terminal from being outputted by the pull-up module to the signal output terminal; on the other hand, the signal of the signal input terminal can be transmitted to the control node through the signal input module, and the pull-down module can be enabled under control of the control node, so that the voltage inputted to the first voltage terminal is transmitted to the signal output terminal, so as to pull down the signal output terminal, which avoids activating the gate line connected to the shift register unit in the non-output phase of the shift register unit.

Hereinafter, the respective modules in the shift register unit described above will be illustratively explained in detail.

Figure 2:
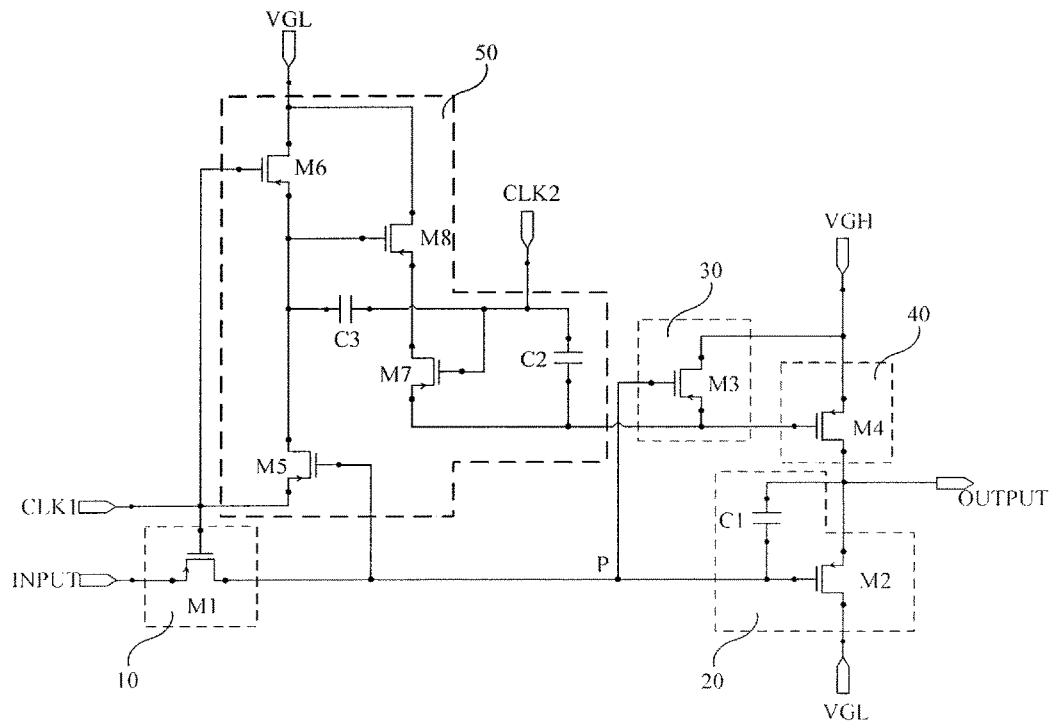
FIG. 2 is a schematic diagram of a specific structure of the shift register unit shown in FIG. 1.

For example, as shown in FIG. 2, the signal input module 10 may comprise: a first transistor M1, a gate of the first transistor M1 is connected to the first clock signal CLK1, a first electrode of the first transistor M1 is connected to the signal input terminal INPUT, and a second electrode of the first transistor M1 is connected to the control node P.

The pull-down module 20 may comprise a second transistor M2 and a first capacitor C1. A gate of the second transistor M2 is connected to the control node P, a first electrode of the second transistor M2 is connected to the signal output terminal OUTPUT, and a second electrode of the second transistor M2 is connected to the first voltage terminal VGL. A first terminal of the first capacitor C1 is connected to the gate of the second transistor M2, and a second terminal of the first capacitor C1 is connected to the first electrode of the second transistor M2.

The first pull-up control module 30 may comprise a third transistor M3, a gate of the third transistor M3 is connected to the control node P, a first electrode of the third transistor M3 is connected to the pull-up module 40, and a second electrode of the third transistor M3 is connected to the second voltage terminal VGH.

The pull-up module 40 may comprise a fourth transistor M4, a gate of the fourth transistor M4 is connected to the first pull-up control module 30 and the second pull-up control module 50, a first electrode of the fourth transistor M4 is connected to the second voltage terminal VGH, and a second electrode of the fourth transistor M4 is connected to the signal output terminal OUTPUT. When the structure of the first pull-up control module 30 is as described above, the gate of the fourth transistor is connected to the first electrode of the third transistor. In this case, the first control terminal and the second control terminal of the pull-up module 40 are the same, and both are the gate of the fourth transistor.

The second pull-up control module 50 may comprise a fifth transistor M5, a sixth transistor M6, a seventh transistor M7, an eighth transistor M8, as well as a second capacitor C2 and a third capacitor C3.

A gate of the fifth transistor M5 is connected to the control node P, a first electrode of the fifth transistor M5 is connected to the first clock signal terminal CLK1, and a second electrode of the fifth transistor M5 is connected to a first electrode of the sixth transistor M6. A gate of the sixth transistor M6 is connected to the first clock signal terminal CLK1, and a second electrode of the sixth transistor M6 is connected to the first voltage terminal VGL. A gate of the seventh transistor M7 is connected to the second clock signal terminal CLK2, a first electrode of the seventh transistor M7 is connected to the pull-up module 40, and a second electrode of the seventh transistor M7 is connected to a first electrode of the eighth transistor M8. When the structure of the pull-up module 40 is as described above, the first electrode of the seventh transistor M7 is connected to the gate of the fourth transistor M4. A gate of the eighth transistor M8 is connected to the first electrode of the sixth transistor M6, and a second electrode of the eighth transistor M8 is connected to the first voltage terminal VGL.

A first terminal of the second capacitor C2 is connected to the second clock signal terminal CLK2, and a second terminal of the second capacitor C2 is connected to the first electrode of the seventh transistor M7. A first terminal of the third capacitor C3 is connected to the first electrode of the sixth transistor M6, a second terminal of the third capacitor C3 is connected to the gate of the seventh transistor M7.

Although the transistors in the respective modules of the shift register unit are shown in the form of P-type transistors in FIG. 2, as will be appreciated, the transistors in the respective modules of the shift register unit described above may be either N-type transistors each or P-type transistors each, and the present disclosure makes no limitations thereto. In a case where the transistors in the respective modules of the shift register unit are P-type transistors each, a low voltage level is inputted to the first voltage terminal VGL, and a high voltage level is inputted to the second voltage terminal VGH.

Figure 4:
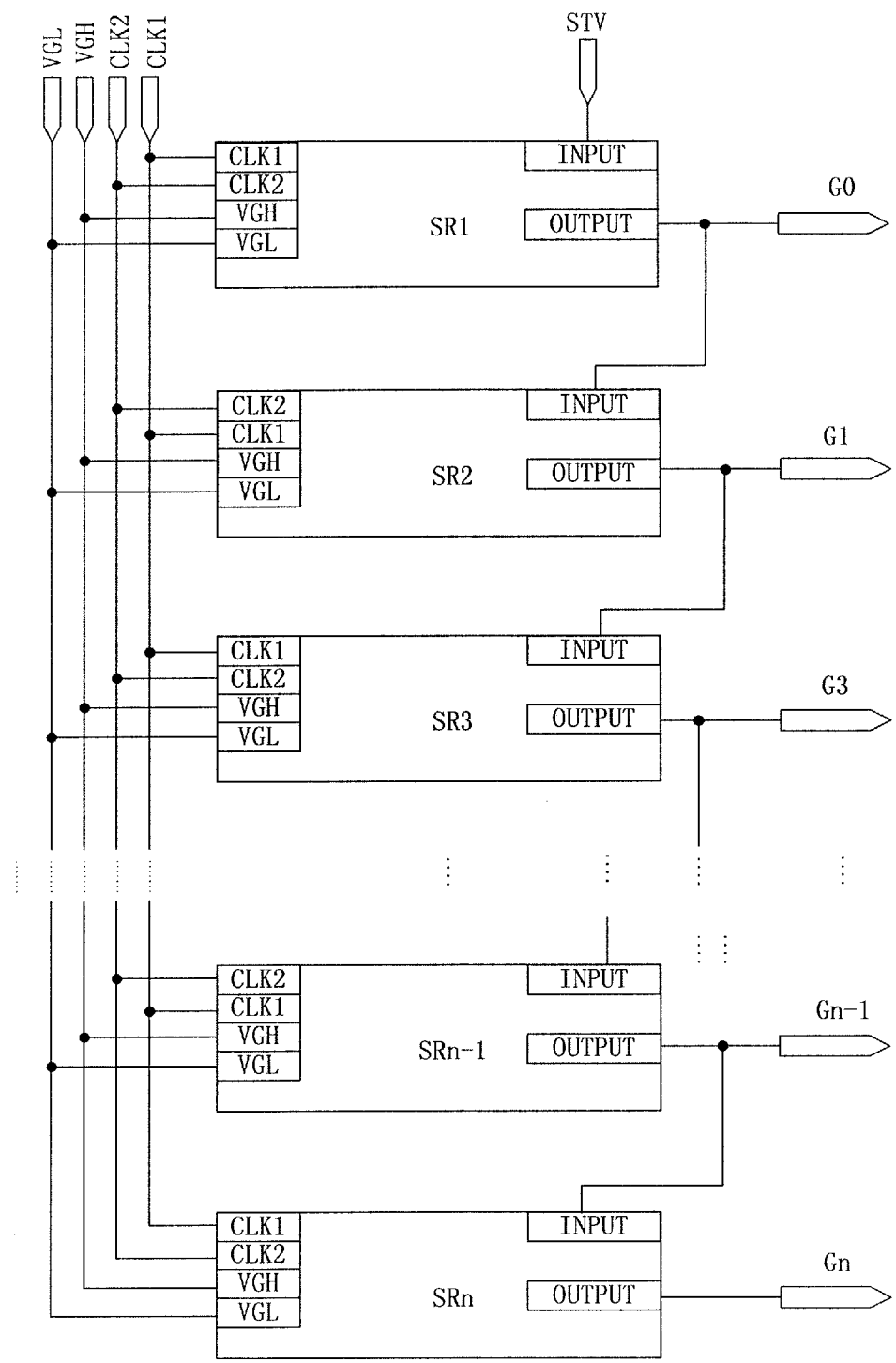
FIG. 4 is a schematic diagram of structure of a gate driving circuit formed by cascading a plurality of stages of the shift register unit shown in FIG. 1 or 2.

According to the embodiments of the present disclosure, there is further provided a gate driving circuit constituted by a plurality of stages of the shift register unit (SR1, SR2, . . . , SRn) as described above. As shown in FIG. 4, a schematic diagram of structure of the gate driving circuit constituted by the shift register unit shown in FIG. 1 or 2 and cascaded in a plurality of stages is shown.

Specifically, as shown in FIG. 4, in respective stage of the shift register unit (SR1, SR2, . . . SRn) of the gate driving circuit described above, a signal input terminal INPUT of the shift register unit SR1 in a first stage is connected to a trigger signal terminal STV; except the shift register unit SR1 in the first stage, a signal input terminal INPUT of the shift register unit in each of the rest stages is connected to a signal output terminal OUTPUT of the shift register unit in an adjacently upper stage.

Accordingly, when a trigger signal is inputted to the trigger signal input terminal STV, the respective stages of shift register units in the gate driving circuit output a gate line scanning signal in sequence, so as to progressively scan the gate lines in the display panel.

The shift register unit in the gate driving circuit described above has the same structure and advantageous effect of the shift register unit provided by the forgoing embodiments. Since the foregoing embodiments have already provided detailed descriptions of the structure and advantageous effect of the shift register unit, no more details are repeated here.

Next, operations of the shift register unit according to the embodiments of the present disclosure will be introduced by taking the P-type transistors as example.

It can be known from FIG. 3 that, the operating process of the shift register unit provided by the embodiments of the present disclosure includes eight phases, hereinafter, the operating process of the shift register units shown in FIG. 1 and FIG. 2 will be explained in detail in combination with the timing signal control diagram shown in FIG. 3. Specifically, explanation is provided by taking the shift register unit SR1 in the first stage as example. The signal input terminal INPUT of the register unit SR1 in the first stage is connected to the trigger signal terminal STV. Operations of the shift register unit SR1 in the rest stages are similar to the operations of the shift register unit SR1 in the first stage, no more details are repeated here.

In a first phase a, a low voltage level is inputted to the first clock signal terminal CLK1, a high voltage level is inputted to the second clock signal terminal CLK2, and a low voltage level is inputted to the signal input terminal INPUT (the signal input terminal INPUT of the register unit SR1 in the first stage is connected to the trigger signal terminal STV).

Figure 5:
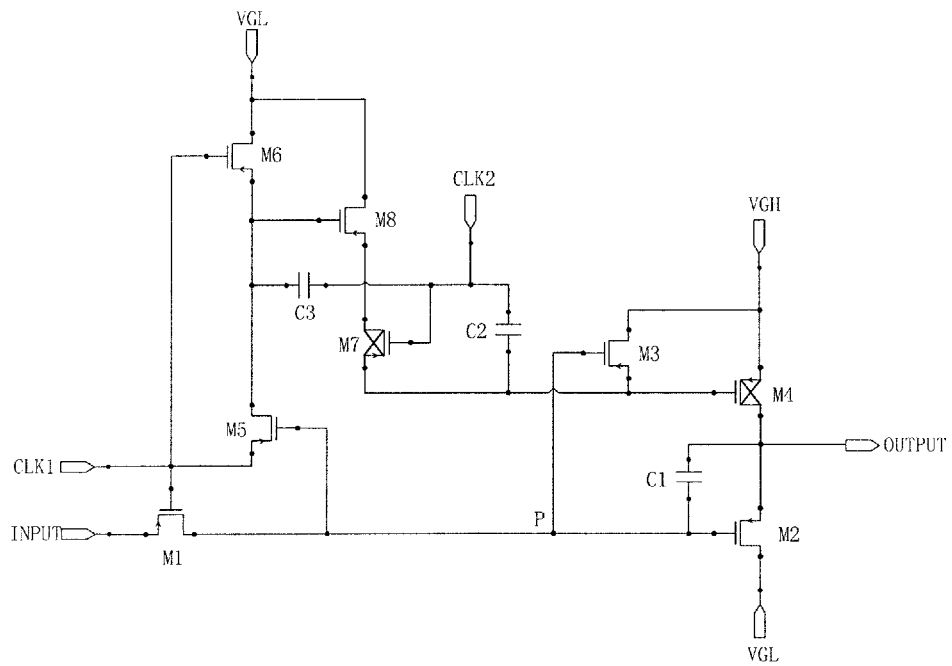
FIG. 5 is an equivalent circuit diagram of the shift register unit shown in FIG. 2 under control of a signal in a first stage a in FIG. 3.

In this case, the signal input module 10 shown in FIG. 1 is enabled to output the signal of the signal input terminal INPUT to the control node P. Specifically, as shown in FIG. 5, a low voltage level is inputted to the first clock signal terminal CLK1 to turn on the first transistor M1, so that the signal input terminal INPUT outputs the low voltage level inputted to the trigger signal terminal STV to the control node P through the first transistor M1.

The pull-down module 20 outputs the signal of the first voltage terminal VGL to the signal output terminal OUTPUT and stores the low voltage level inputted to the signal input terminal INPUT under control of the control node P. Specifically, since the potential of the control node P is a low voltage level, thus the second transistor M2 is turned on under control of the control node P, and the signal inputted to the first voltage terminal VGL is outputted to the signal output terminal OUTPUT. In addition, the low voltage level inputted to the signal input terminal INPUT is stored by the first capacitor C1.

In addition, the first pull-up control module 30 outputs a disabling signal under control of the control node P to the pull-up module 40, so that the pull-up module 40 is disabled. The disabling signal is a high voltage level inputted from the second voltage terminal VGH, and is used to turn off the fourth transistor M4, thereby disabling the pull-up module 40.

Specifically, the third transistor M3 is turned on under control of the low voltage level of the control node P, and the signal of the second voltage terminal VGH is outputted to the gate of the fourth transistor M4 through the third transistor M3, since the second voltage terminal VGH outputs a high voltage level, in this case, the fourth transistor M4 is in a turned-off state, thereby preventing the high voltage level of the second voltage terminal VGH from being outputted to the signal output terminal OUTPUT.

In addition, the second pull-up control module 50 stores the signal of the first voltage terminal VGL under control of the control node P and the first clock signal terminal CLK1, and the second pull-up control module 50 does not output an enabling signal to the pull-up module 40 under control of the second clock signal terminal CLK2. Specifically, the fifth transistor M5 is in a turned-on state under control of the control node P, and the low voltage level inputted to the first signal terminal CLK1 is outputted to the gate of the sixth transistor M6 and the gate of the eighth transistor M8, so that the sixth transistor M6 and the eighth transistor M8 are in a turned-on state. In this case, the low voltage level inputted to the first voltage terminal VGL is stored by the third capacitor C3. However, in this phase, a high voltage level is inputted to the second clock signal terminal CLK2, the seventh transistor M7 is turned off, so that the signal of the first voltage terminal VGL cannot be outputted to the fourth transistor M4 through the seventh transistor M7 even if the eighth transistor is turned on, therefore, the second pull-up control module 50 does not output an enabling signal to the pull-up module 40. Herein, the enabling signal is the low voltage level inputted to the first voltage terminal VGL, and is used to turn on the fourth transistor M4, thereby enabling the pull-up module 40.

To sum up, in the first phase a, the signal output terminal OUTPUT outputs a low voltage level signal of the first voltage terminal VGL, and does not output a high voltage level signal.

In the first phase a, both terminals of the first capacitor C1 are at low voltage levels, the first capacitor C1 stores the low voltage level of the input signal terminal INPUT; both terminals of the second capacitor C2 are at high voltage levels; one terminal of the third capacitor C3 is at the high voltage level inputted to the second clock signal terminal CLK2, and the other terminal of the third capacitor C3 is at the low voltage level inputted to the first voltage terminal VGL, the third capacitor C3 stores the low voltage level of the first voltage terminal VGL.

In the second phase b, a high voltage level is inputted to the first clock signal terminal CLK1, a low voltage level is inputted to the second clock signal terminal CLK2, and a low voltage level is inputted to the trigger signal terminal STV.

Figure 6:
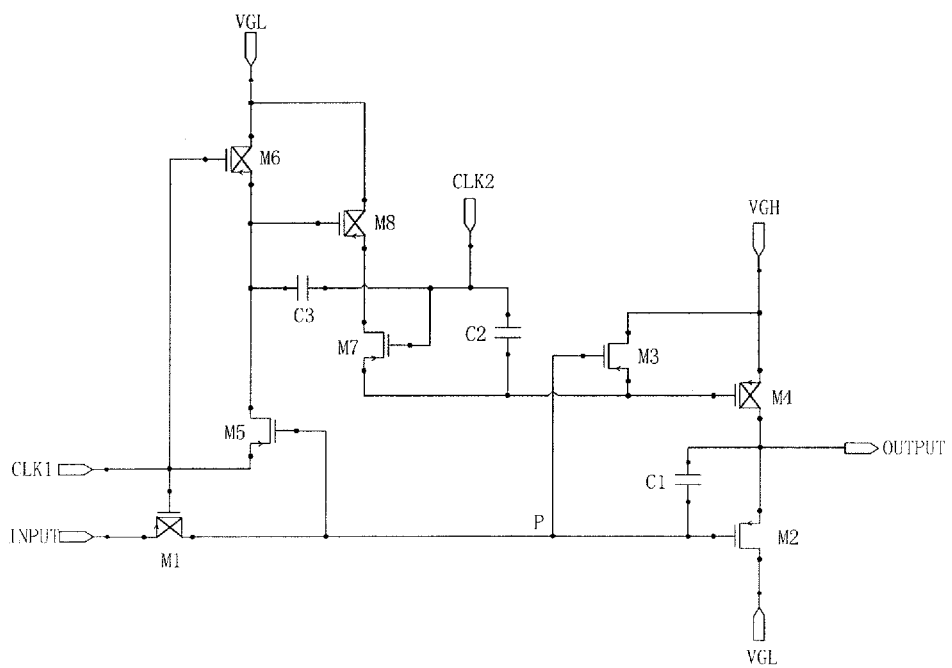
FIG. 6 is an equivalent circuit diagram of the shift register unit shown in FIG. 2 under control of a signal in a second stage b in FIG. 3.

In this case, the signal input module 10 is disabled, and the pull-down module 20 outputs the signal of the first voltage terminal VGL to the signal output terminal OUTPUT and maintains the potential of the control node P to be the same as the potential of the control node P in the first phase a by means of using the stored low voltage level inputted by the signal input terminal INPUT in the first phase a. Specifically, as shown in FIG. 6, since a high voltage level is inputted to the first clock signal terminal CLK1, thus the first transistor M1 is in a turned-off state. The first capacitor C1 maintains the potential of the control node P to be the same as the potential of the control node P in the first phase a.

The first pull-up control module 30 outputs a disabling signal to the pull-up module 40 under control of the control node P, i.e., outputting the signal of the second voltage terminal VGH to the pull-up module 40, so that the pull-up module 40 is disabled. Specifically, the third transistor M3 is turned on under control of the low voltage level of the control node P, and the signal of the second voltage terminal VGH is outputted to the gate of the fourth transistor M4 through the third transistor M3, and since the second voltage terminal VGH outputs a high voltage level, in this case, the fourth transistor M4 is in a turned-off state, thereby preventing the high voltage level of the second voltage terminal VGH from being outputted to the signal output terminal OUTPUT.

The second pull-up control module 50 stores the signal of the first clock signal terminal CLK1 under control of the control node P, and the output terminal of the second pull-up control module 50 does not output an enabling signal to the pull-up module 40 under control of the first clock signal terminal CLK1. Specifically, the fifth transistor M5 is in a turned-on state under control of the control node P, and the high voltage level inputted to the first signal terminal CLK1 is outputted to the gate of the sixth transistor M6 and the gate of the eighth transistor M8, so that the sixth transistor M6 and the eighth transistor M8 are in a turned-off state. In this case, the high voltage level inputted to the first clock signal terminal CLK1 is stored by the third capacitor C3, and the second capacitor C2 stores the high voltage level of the second voltage terminal VGH. Although a low voltage level is inputted to the second clock signal terminal CLK2 so as to turn on the seventh transistor M7, since the eighth transistor M8 is in a turned-off state, thus the signal inputted to the first clock signal terminal CLK1 cannot be outputted to the fourth transistor M4 through the eighth transistor M8 and the seventh transistor M7, therefore, the second pull-up control module 50 does not output an enabling signal to the pull-up module 40.

To sum up, in the second phase b, the signal output terminal OUTPUT outputs a low voltage level signal of the first voltage terminal VGL, and does not output a high voltage level signal.

In the second phase b, both terminals of the first capacitor C1 are at low voltage levels; one terminal of the second capacitor C2 is a high voltage level of the second voltage terminal VGH and the other terminal of the second capacitor C2 is a low voltage level inputted to the second clock signal terminal CLK2, the second capacitor C2 stores the high voltage level of the second voltage terminal VGH; one terminal of a third capacitor C3 is a high voltage level inputted to the first clock signal terminal CLK1 and the other terminal of the third capacitor C3 is a low voltage level inputted to the second clock signal terminal CLK2, the third capacitor C3 stores the high voltage level of the clock signal terminal CLK1.

In the third phase c, a low voltage level is inputted to the first clock signal CLK1, a high voltage level is inputted to the second clock signal CLK2, and a scanning signal, i.e., a high voltage level, is inputted to the trigger signal STV.

Figure 7:
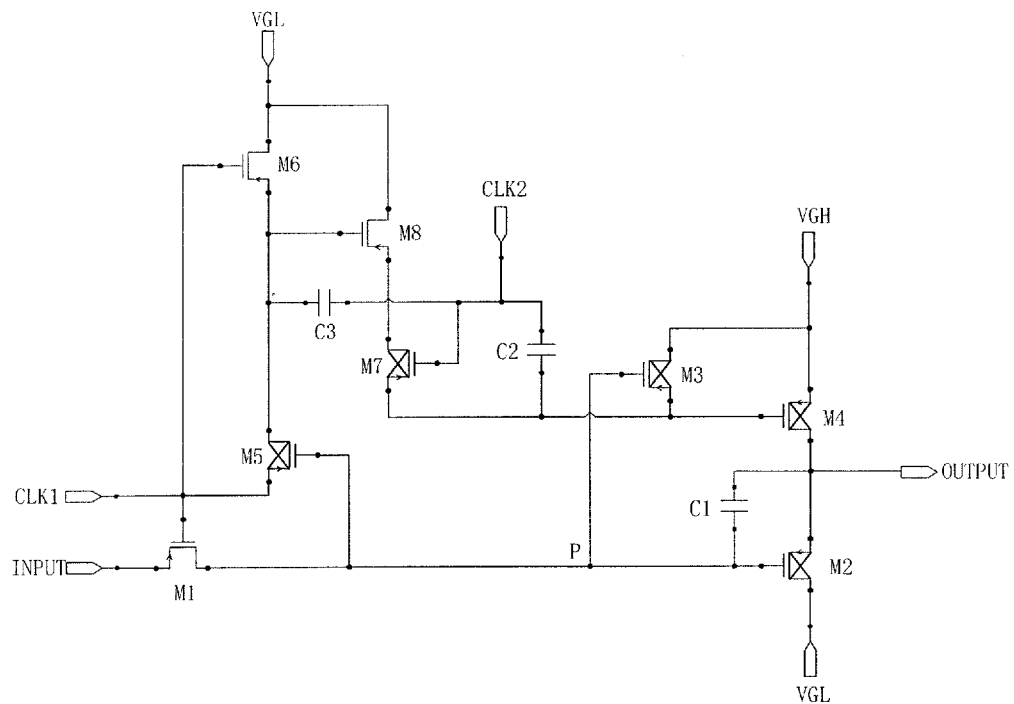
FIG. 7 is an equivalent circuit diagram of the shift register unit shown in FIG. 2 under control of a signal in a third stage c in FIG. 3.

In this case, the signal input module 10 is enabled to output the signal of the signal input terminal INPUT to the control node P. Specifically, as shown in FIG. 7, a low voltage level is inputted to the first clock signal terminal CLK1, thus the first transistor M1 can be turned on, so that the signal input terminal INPUT outputs the high voltage level inputted to the trigger signal terminal STV to the control node P through the first transistor M1.

The pull-down module 20 is disabled under control of the control node P, and the pull-down module 20 stores the signal of the signal input terminal INPUT. Specifically, since the potential of the control node P is a high voltage level, thus the second transistor M2 is turned off under control of the control node P, so that the signal inputted to the first voltage terminal VGL is not outputted to the signal output terminal OUTPUT. In this case, the high voltage level inputted to the signal input terminal INPUT is stored by the first capacitor C1.

The first pull-up control module 30 is in a disabled state under control of the control node P, and outputs no disabling signal to the pull-up module 40. Specifically, since the potential of the control node P is a high voltage level, thus the third transistor M3 is in a turned-off state under control of the control node P.

The second pull-up control module 50 stores the signal of the first voltage terminal VGL under control of the control node P and the first clock signal terminal CLK1, and the output terminal of the second pull-up control module 50 does not output an enabling signal to the pull-up module 40 under control of the second clock signal terminal CLK2. Specifically, since the potential of the control node P is a high voltage level, thus the fifth transistor M5 is in a turned-off state. The low voltage level inputted to the first clock signal terminal CLK1 turns on the sixth transistor M6, so that the signal of the first voltage terminal VGL is transmitted to the gate of the eighth transistor M8 so as to turn on the eighth transistor M8, in addition, the signal of the first voltage terminal VGL is stored by the third capacitor C3. Since a high voltage level is inputted to the second clock signal terminal CLK2, thus the seventh transistor M7 is turned off. Therefore, the signal of the first voltage terminal VGL cannot be outputted to the fourth transistor M4 through the seventh transistor M7 even if the eighth transistor M8 is turned on. In addition, the output terminal of the second pull-up control module 50 shows a high voltage level due to capacitive coupling of the second capacitor C2, so that the second pull-up control module 50 does not output an enabling signal to the pull-up module 40 in this phase.

In this case, the pull-up module 40 is in a disabled state. Specifically, since the second pull-up control module 50 does not output an enabling signal to the pull-up module 40, and the first pull-up control module 30 does not output a disabling signal to the pull-up module 40 either, thus the fourth transistor M4 maintains the turned-off state in the previous phase. The signal output terminal OUTPUT maintains the low voltage level inputted from the first voltage terminal VGL in the previous phase.

To sum up, in the third phase c, the signal output terminal OUTPUT does not output a high voltage level signal.

In the third phase c, one terminal of the first capacitor C1 is the high voltage level of the input signal terminal INPUT, and the other terminal of the first capacitor C1 is a low voltage level, the first capacitor C1 stores the high voltage level of the input signal terminal INPUT; both terminals of the second capacitor C2 are at high voltage levels; one terminal of the third capacitor C3 is a high voltage level of the second clock signal terminal CLK2, and the other terminal of the third capacitor C3 is a low voltage level of the first voltage terminal VGL, the third capacitor C3 stores the low voltage level of the first voltage terminal VOL.

In a fourth phase d, a high voltage level is inputted to the first clock signal CLK1, a low voltage level is inputted to the second clock signal CLK2, and a high voltage level is inputted to the trigger signal STV.

Figure 8:
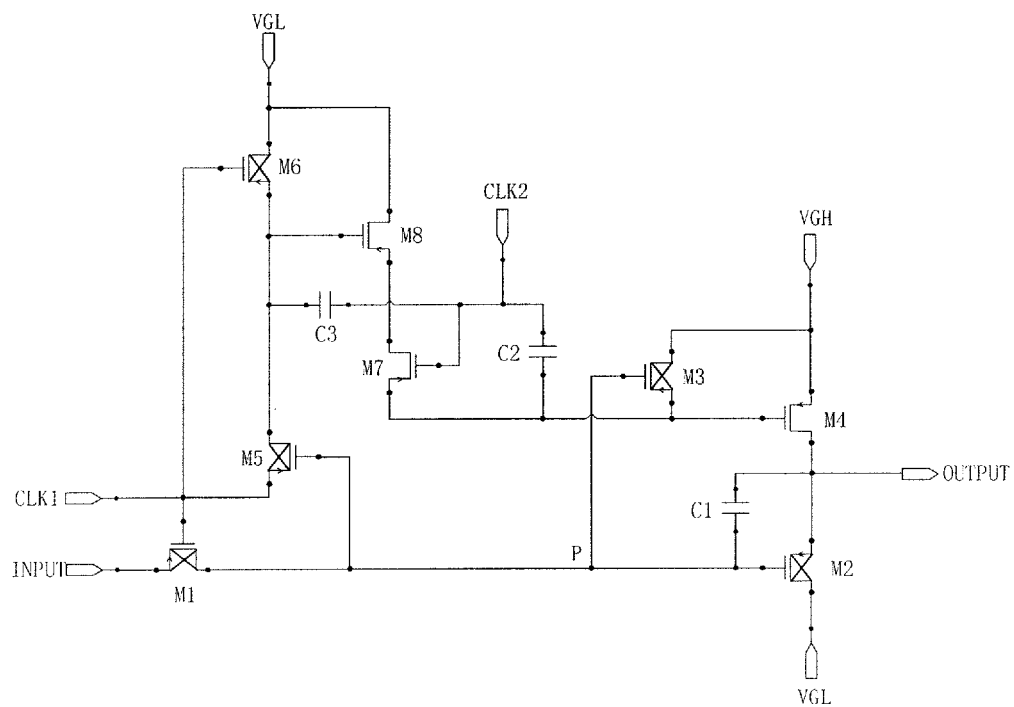
FIG. 8 is an equivalent circuit diagram of the shift register unit shown in FIG. 2 under control of a signal in a fourth stage d in FIG. 3.

In this case, the signal input module 10 is disabled, and the pull-down module 20 maintains the potential of the control node P to be the same as the potential of the control node P in the third phase c by means of using the signal of the signal input terminal INPUT as stored in the third phase c; the pull-down module 20 is disabled, and does not output a signal to the signal output terminal OUTPUT. Specifically, as shown in FIG. 8, since a high voltage level is inputted to the first clock signal terminal CLK1, thus the first transistor M1 is in a turned-off state. Since the first capacitor C1 stores the high voltage level of the signal input terminal INPUT in the third phase c, thus, in the fourth phase d, the first capacitor C1 maintains the control node P to be at the high voltage level. In this case, the potential of the control node P is a high voltage level and the second transistor M2 is in a turned-off state, thus the pull-down module 20 does not output the signal of the first voltage terminal VGL.

The first pull-up control module 30 is in a disabled state under control of the control node P. Specifically, since the potential of the control node P is a high voltage level, the third transistor M3 is in a turned-off state.

The second pull-up control module 50 outputs an enabling signal to the pull-up module 40 under control of the control node P, the first clock signal terminal CLK1 and the second clock signal terminal CLK2, i.e., the second pull-up control module 50 outputs the signal of the first voltage terminal VGL to the pull-up module 40, and the pull-up module 40 outputs the signal of the second voltage terminal VGH to the signal output terminal OUTPUT. Specifically, since the potential of the control node P is a high voltage level, the fifth transistor M5 is in a turned-off state. A high voltage level is inputted to the first clock signal terminal CLK1, thus the sixth transistor M6 is turned off. Since the third capacitor C3 stores the low voltage level of the first voltage terminal VGL in the previous phase, thus, in the fourth phase, the third capacitor C3 maintains the gate of the eighth transistor M8 to be at the low voltage level, so that the eighth transistor M8 is turned on. Further, since a low voltage level is inputted to the second clock signal terminal CLK2, the seventh transistor M7 is turned on, so that the gate of the fourth transistor M4 is at a low voltage level (specifically VGL+Vth, Vth<0 and is a threshold voltage of the seventh transistor M7). In this case, both terminals of the second capacitor C2 are at low voltage levels, specifically, a voltage at one terminal of the second capacitor C2 is the voltage of the first voltage terminal VGL and a voltage at the other terminal of the second capacitor C2 is VGL+Vth, the second capacitor C2 stores the threshold voltage Vth of the seventh transistor M7. Therefore, the low voltage level inputted to the first voltage terminal VGL is transmitted to the gate of the fourth transistor M4 through the eighth transistor M8 and the seventh transistor M7, so that the fourth transistor M4 is turned on, and the high voltage level inputted to the second voltage terminal VGH is transmitted to the signal output terminal OUTPUT through the fourth transistor M4.

To sum up, the fourth phase d is the high voltage level output phase of the shift register unit.

In the fourth phase d, both terminals of the first capacitor C1 are at high voltage levels; both terminals of the second capacitor C2 are at low voltage levels; and both terminals of the third capacitor C3 are at low voltage levels.

In a fifth phase e, a low voltage level is inputted to the first clock signal CLK1, a high voltage level is inputted to the second clock signal CLK2, and a high voltage level is inputted to the trigger signal STV.

Figure 9:
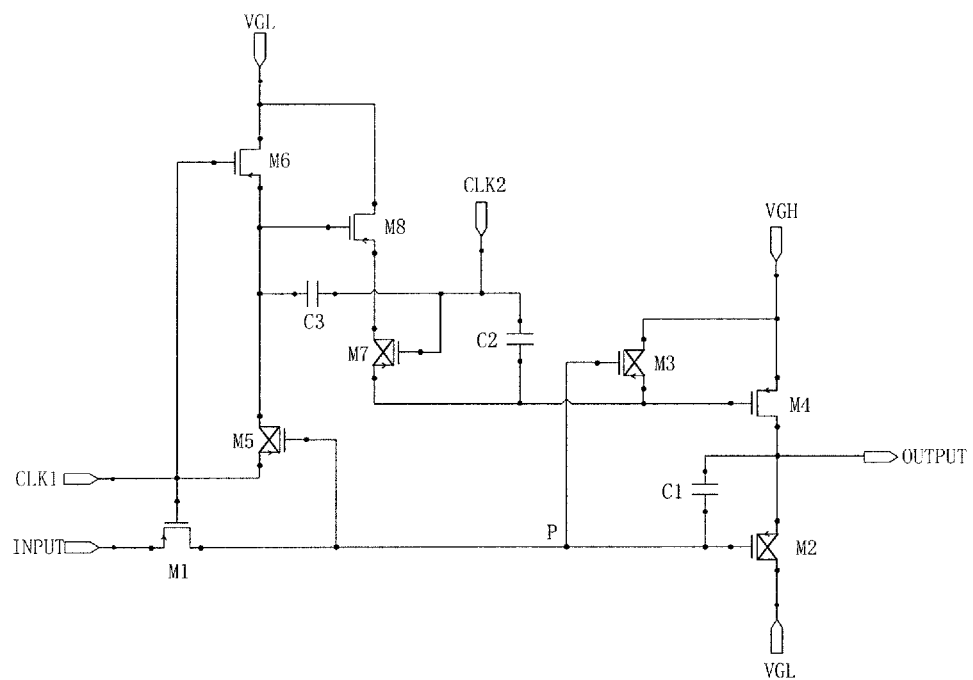
FIG. 9 is an equivalent circuit diagram of the shift register unit shown in FIG. 2 under control of a signal in a fifth stage e in FIG. 3.

In this case, the signal input module 10 is enabled, and outputs the signal of the signal input terminal INPUT to the control node P. Specifically, as shown in FIG. 9, since a low voltage level is inputted to the first clock signal terminal CLK1, the first transistor M1 is turned on, and the high voltage level inputted to the trigger signal terminal STV is outputted to the control node P through the signal input terminal INPUT.

The pull-down module 20 does not output a low voltage level signal of the first voltage terminal VGL to the output signal terminal OUTPUT under control of the control node P, and the pull-down module 20 stores the high voltage level signal of the signal input terminal INPUT. Specifically, since the potential of the control node P is a high voltage level, the second transistor M2 is in a turned-off state, so that the signal of the first voltage terminal VGL will not be transmitted to the signal output terminal OUTPUT. In addition, the first capacitor C1 stores the high voltage level inputted to the signal input terminal INPUT.

The first pull-up control module 30 is in a disabled state under control of the control node P. Specifically, since the control node P is a high voltage level, the third transistor M3 is in a turned-off state.

The second pull-up control module 50 stores the low voltage level signal of the first voltage terminal VGL under control of the control node P and the first clock terminal CLK1. Specifically, since the potential of the control node P is a high voltage level, the fifth transistor M5 is in a turned-off state. A low voltage level is inputted to the first clock terminal CLK1, the sixth transistor M6 is turned on, the low voltage level inputted to the first voltage terminal VGL is outputted to the gate of the eighth transistor M8, and the eighth transistor M8 is turned on. In this case, one terminal of the third capacitor C3 is the low voltage level of the first voltage terminal VGL, and the other terminal of the third capacitor C3 is the high voltage level of the second clock signal terminal CLK2, the third capacitor C3 stores the low voltage level inputted to the first voltage terminal VGL. In addition, since a high voltage level is inputted to the second clock signal terminal CLK2, thus the seventh transistor M7 is in a turned-off state.

In addition, the output terminal of the second pull-up control module 50 outputs an enabling signal to the pull-up module 40 under control of the second clock signal terminal CLK2 due to presence of the second capacitor C2. Specifically, due to presence of the second capacitance C2, when the second clock signal terminal CLK2 jumps to the high voltage level VGH in the fifth phase, the voltage of one terminal connected to the pull-up module 40 of the second capacitor C2 jumps to VGH+Vth. Assuming that a threshold voltage of the seventh transistor M7 and a threshold voltage of the fourth transistor M4 are the same, the pull-up module 40 can be maintained in the enabled state when the voltage at one terminal connected to the pull-up module 40 of the second capacitor C2 jumps to VGH+Vth, so that the signal of the second voltage terminal VGH is outputted to the signal output terminal OUTPUT. Specifically, since the output terminal of the second pull-up control module 50 is connected to the gate of the fourth transistor, and the voltage at the output terminal of the second pull-up control module 50 in the fifth phase is lower than the voltage |Vth| of the second voltage terminal VGH (i.e., keeping outputting an enabling signal to the pull-up module 40), thus a gate-source voltage Vgs of the fourth transistor M4 is VGL+Vth−VGH in the fourth phase and is Vth in the fifth phase. In a case where the threshold voltage of the fourth transistor M4 and the threshold voltage of the seventh transistor M7 are the same as described above, accordingly, the fourth transistor M4 maintains the tuned-on state of the previous phase in the fifth phase and transmits the high voltage level inputted to the second voltage terminal VGH to the signal output terminal OUTPUT.

To sum up, the fifth phase e is the high voltage level output phase of the shift register unit.

In the fifth phase e, both terminals of the first capacitor C1 are at high voltage levels, the first capacitor C1 stores the high voltage level of the signal input terminal INPUT; one terminal of the second capacitor C2 is the voltage VGH of the second clock signal terminal CLK2, and the other terminal of the second capacitor C2 is a voltage that is less than the voltage VGH by |Vth|; one terminal of the third capacitor C3 is the high voltage level of the second clock signal terminal CLK2, and the other terminal of the third capacitor C3 is the low voltage level of the first voltage source VGL.

In a sixth phase f, a high voltage level is inputted to the first clock signal CLK1, a low voltage level is inputted to the second clock signal CLK2, and a low voltage level is inputted to the trigger signal STV.

Figure 10:
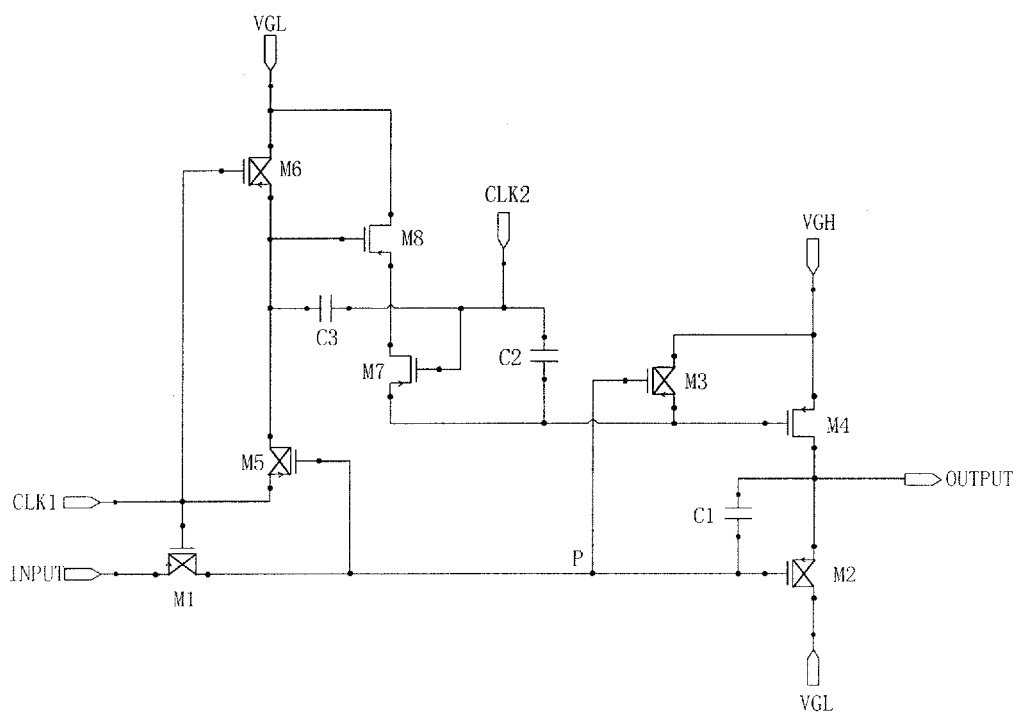
FIG. 10 is an equivalent circuit diagram of the shift register unit shown in FIG. 2 under control of a signal in a sixth stage f in FIG. 3.

In this case, the signal input module 10 is disabled, and the pull-down module 20 maintains the voltage level at the control node P to be the same as the voltage level at the node P in a previous phase according to the high voltage level of the signal input terminal INPUT as stored in the previous phase; the pull-down module 20 does not output the low voltage level of the first voltage source VGL to the signal output terminal OUTPUT. Specifically, as shown in FIG. 10, since a high voltage level is inputted to the first clock signal terminal CLK1, thus the first transistor M1 is in a turned-off state. The first capacitor C1 maintains the control node P to be at a high voltage level. The second transistor M2 is in a turned-off state under control of the high voltage level of the control node P.

The first pull-up control module 30 is in a disabled state under control of the control node P. Specifically, since the control node P is a high voltage level, the third transistor M3 is in a turned-off state.

The second pull-up control module 50 outputs an enabling signal to the pull-up module 40 under control of the control node P, the first clock signal terminal CLK1 and the second clock signal terminal CLK2, i.e., the second pull-up control module 50 outputs the signal of the first voltage terminal VGL to the pull-up module 40, and the pull-up module 40 outputs the signal of the second voltage terminal VGH to the signal output terminal OUTPUT. Specifically, since the potential of the control node P is a high voltage level, the fifth transistor M5 is turned off, a high voltage level is inputted to the first clock signal terminal CLK1, and the sixth transistor M6 is turned off. The third capacitor C3 causes the gate of the eighth transistor M8 to be at a low voltage level, and the eighth transistor M8 is turned on. A low voltage level is inputted to the second clock signal terminal CLK2 to turn on the seventh transistor M7, and the low voltage level inputted to the first voltage terminal VGL is transmitted to the gate of the fourth transistor M4 through the eighth transistor M8 and the seventh transistor M7, the transistor M4 is turned on, and the high voltage level inputted to the second voltage terminal VGH is outputted to the signal output terminal OUTPUT.

To sum up, the sixth phase f is the high voltage level output phase of the shift register unit.

In the sixth phase f, both terminals of the first capacitor C1 are at high voltage levels; both terminals of the second capacitor C2 are at low voltage levels; and both terminals of the third capacitor C3 are at low voltage levels.

In a seventh phase g, a low voltage level is inputted to the first clock signal CLK1, a high voltage level is inputted to the second clock signal CLK2, and a low voltage level is inputted to the trigger signal STV.

Figure 11:
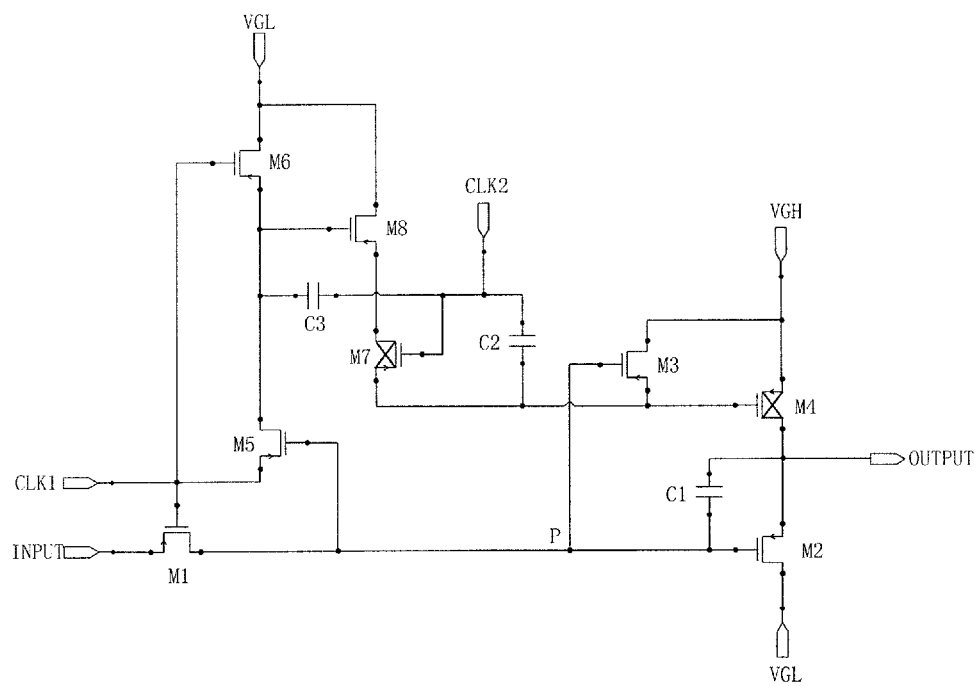
FIG. 11 is an equivalent circuit diagram of the shift register unit shown in FIG. 2 under control of a signal in a seventh stage g in FIG. 3.

In this case, the signal input module 10 is enabled, and the signal of the signal input terminal INPUT is outputted to the control node P. Specifically, as shown in FIG. 11, a low voltage level is inputted to the first clock signal terminal CLK1, and the first transistor M1 is turned on, so that the low voltage level inputted to the trigger signal terminal STV is outputted to the first transistor M1 through the signal input terminal INPUT, and further outputted to the control node P through the first transistor M1.

The pull-down module 20 outputs the signal of the first voltage terminal VGL to the signal output terminal OUTPUT and stores the signal of the signal input terminal INPUT under control of the control node P. Specifically, since the potential of the control node P is a low voltage level, the second transistor M2 is turned on, and the signal of the first voltage terminal VGL is outputted to the signal output terminal OUTPUT. In this case, the first capacitor C1 stores the low voltage level inputted to the signal input terminal INPUT.

The first pull-up control module 30 outputs a disabling signal to the pull-up module 40 under control of the control node P, i.e. the first pull-up control module 30 outputs the signal of the second voltage terminal VGH to the pull-up module 40, to cause the pull-up module 40 to be in a disabled state. Specifically, since the potential of the control node P is a low voltage level, the third transistor M3 is turned on, the high voltage level inputted to the second voltage terminal VGH is outputted to the gate of the fourth transistor M4, and the fourth transistor M4 is turned off.

The second pull-up control module 50 stores the signal of the first voltage terminal VGL under control of the control node P and the first clock signal terminal CLK1, and the output terminal of the second pull-up control module 50 does not output an enabling signal to the pull-up module 40 under control of the second clock signal terminal CLK2. Specifically, since the control node P is a low voltage level, the fifth transistor M5 is turned on. In addition, a low voltage level is inputted to the first clock signal terminal CLK1, the sixth transistor M6 and the eighth transistor M8 are both turned on, and the low voltage level inputted to the first voltage terminal VGL is stored in the third capacitor C3 through the sixth transistor M6. However, a high voltage level is inputted to the second clock signal terminal CLK2, so that the seventh transistor M7 is in a turned-off state, thus the output terminal of the second pull-up control module 50 does not output an enabling signal to the pull-up module 40.

To sum up, in the seventh phase g, the signal output terminal OUTPUT has no high voltage level signal output.

In the seventh phase g, both terminals of the first capacitor C1 are at low voltage levels; both terminals of the second capacitor C2 are at high voltage levels; one terminal of the third capacitor C3 is a low voltage level of the first voltage terminal VGL and the other terminal of the third capacitor C3 is a high voltage level of the second clock signal terminal CLK2, the third capacitor C3 stores the low voltage level of the first voltage terminal VGL.

In the eighth phase h; a high voltage level is inputted to the first clock signal CLK1, a low voltage level is inputted to the second clock signal CLK2, and a low voltage level is inputted to the trigger signal STV.

Figure 12:
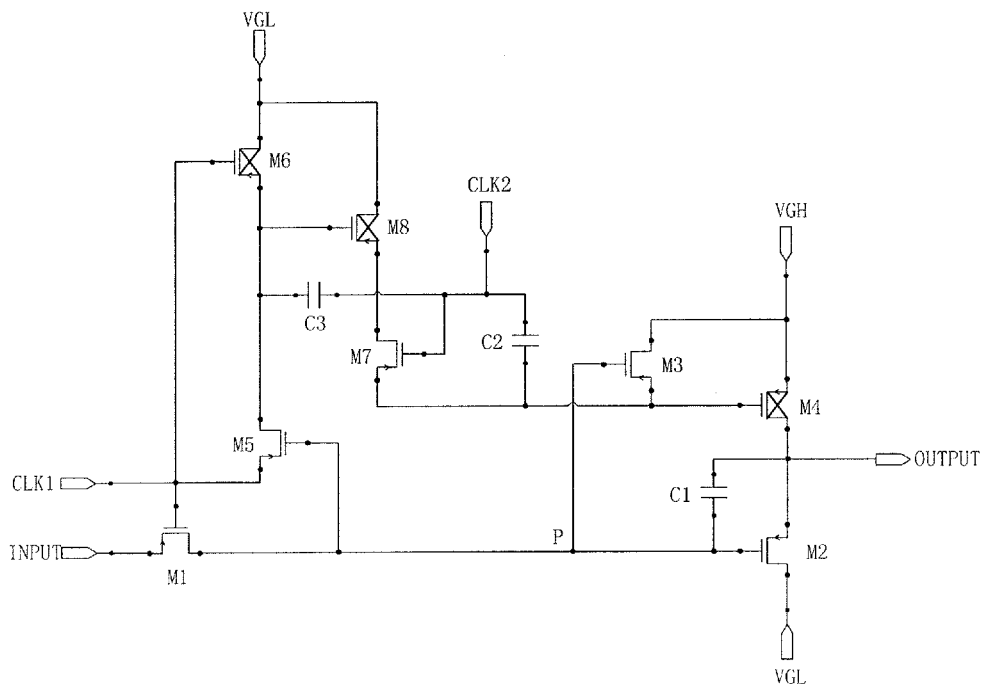
FIG. 12 is an equivalent circuit diagram of the shift register unit shown in FIG. 2 under control of a signal in an eighth stage h in FIG. 3.

In this case, the signal input module 10 is disabled, and the pull-down module 20 maintains the voltage level of the control node P to be the same as the voltage level of the control node P in the previous phase; the pull-down module 20 outputs the signal of the first voltage terminal VGL to the signal output terminal OUTPUT. Specifically, as shown in FIG. 12, since a high voltage level is inputted to the first clock signal terminal CLK1, thus the first transistor M1 is in a turned-off state. The first capacitor C1 maintains the control node P to be at a low voltage level.

The first pull-up control module 30 outputs a disabling signal to the pull-up module 40 under control of the control node P, i.e., the first pull-up control module 30 outputs a signal of the second voltage terminal VGH to the pull-up module 40, so that the pull-up module 40 is in a disabled state. Specifically, since the potential of the control node P is a low voltage level, thus the third transistor M3 is turned on, the high voltage level inputted to the second voltage terminal VGH is outputted to the gate of the fourth transistor M4, and the fourth transistor M4 is turned off, so that the pull-up module 40 is in a disabled state.

The output terminal of the second pull-up control module 50 does not output an enabling signal to the pull-up module 40 under control of the control node P, the first clock signal terminal CLK1 and the second clock signal terminal CLK2. Specifically, since the control node P is a low voltage level, thus the fifth transistor M5 is turned on. A high voltage level is inputted to the first clock signal terminal CLK1, the sixth transistor M6 and the eighth transistor M8 are turned off, one terminal of the third capacitor C3 is the high voltage level inputted to the first clock signal terminal CLK1, and the other terminal of the third capacitor C3 is the low voltage level inputted to the second clock signal terminal CLK2. Although a low voltage level is inputted to the second clock signal terminal CLK2 and the seventh transistor M7 is turned on, since the eighth transistor M8 is turned off, thus the signal of the first voltage terminal VGL cannot be transmitted to the gate of the fourth transistor M4 through the eighth transistor M8 and the seventh transistor M7, so that the output terminal of the second pull-up control module 50 does not output an enabling signal to the pull-up module 40.

Figure 3:
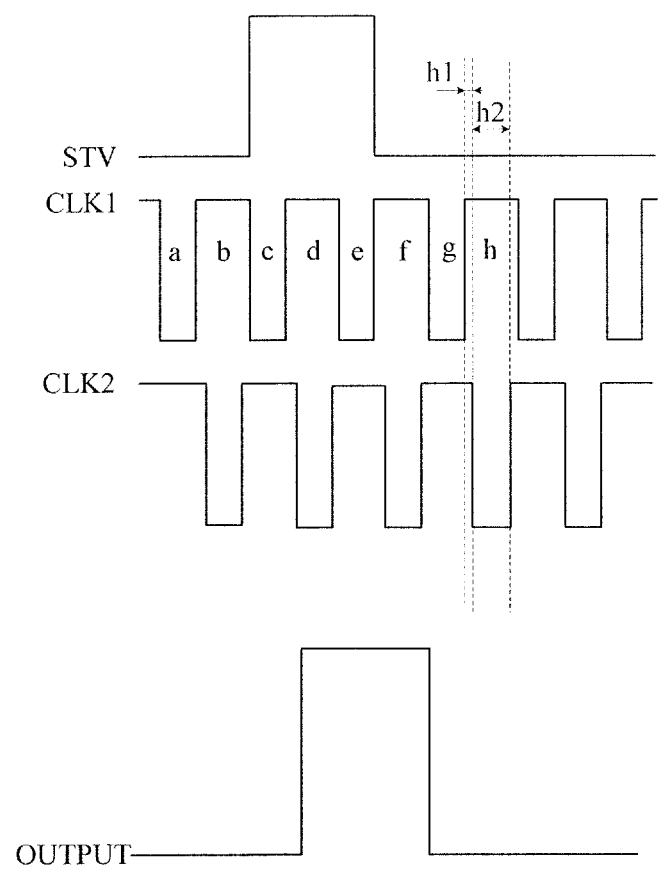
FIG. 3 is a timing diagram of a control signal for driving the shift register unit shown in FIG. 2.

In addition, as shown in FIG. 3, if the eighth phase h is refined, it may be divided into a phase h1 and a phase h2. In the phase h1, a high voltage level is inputted to the first clock signal CLK1, a high voltage level is inputted to the second clock signal terminal CLK2, and a low voltage level is inputted to the trigger signal STV. In the phase h2, a high voltage level is inputted to the first clock signal CLK1, a low voltage level is inputted to the second clock signal CLK2, and a low voltage level is inputted to the trigger signal STV. Since the phase h1 is shorter than the phase h2 in time length, the eighth phase h is mainly the phase h2.

The phase h1 differs from the phase h2 in that the second clock signal terminal CLK2 also outputs a high voltage level, so that the seventh transistor M7 is in a turned-off state, thus, still, the signal of the first voltage terminal VGL cannot be transmitted to the gate of the fourth transistor M4 through the eighth transistor M8 and the seventh transistor M7, therefore, the output terminal of the second pull-up control module 50 still does not output an enabling signal to the pull-up module 40.

To sum up, in the eighth phase h, the signal output terminal OUTPUT has no high voltage level signal output.

The first time period may include the first phase a, the second phase b, the seventh phase g, and the eighth phase h; the second time period may include the fourth phase d, the fifth phase e, and the sixth phase f.

It needs to be noted that, first, in the embodiments of the present disclosure, since a signal output width of the first clock signal terminal CLK1 and a signal output width of the second clock signal terminal CLK2 are different, thus each phase of the first phase a to the seventh phase g may be divided into two parts like the eighth phase h. In the partial phase that is shorter, the signal of the first clock signal terminal CLK1 and the signal of the second clock signal terminal CLK2 are both at high voltage levels or both at low voltage levels, for example, in the phase h1, the signal of the first clock signal terminal CLK1 and the signal of the second clock signal CLK2 are both at high voltage levels. Within the partial phase that is longer, one of the signal of the first clock signal terminal CLK1 and the signal of the second clock signal terminal CLK2 is a high voltage level and the other of the two is a low voltage level. For example, in the phase h2, a high voltage level is inputted to the first clock signal CLK1, and a low voltage level is inputted to the second clock signal CLK2. In the above description, for the sake of illustration, only the eighth phase h has been sub-divided, the other phases can also be divided likewise. However, when describing the operating state of the shift register unit, it is mainly described based on the partial phase that is longer. For example, as for the operating state of the shift register unit in the eighth phase h, the operating state of the shift register unit is described mainly based on the phase h2.

Second, after the eighth phase h and before a trigger signal is inputted to the trigger signal terminal STV for the next time, the operating state of the shift register unit will repeat the seventh phase g and the eighth phase h described above, so that a low voltage level inputted to the first voltage terminal is stably outputted to the signal output terminal OUTPUT.

Third, the above description of the operating process of the shift register unit is provided with the shift register unit SR1 in first stage in the gate driving circuit shown in FIG. 4 as an example. The operating principle of the other shift register units can be obtained likewise, no more details are repeated here.

Fourth, when the transistors in the shift register unit described above all are N-type transistors, it is necessary to invert the timing signals as shown in FIG. 3, in addition, it needs to, in the shift register unit shown in FIG. 2, connect the transistor connected to the first voltage terminal VGL to the second voltage terminal VGH, and connect the transistor connected to the second voltage terminal VGH to the first voltage terminal VGL. The specific operating process is the same as that of the shift register unit composed by P-type transistors.

To sum up, in each of the first phase a, the second phase b, the third phase c, the seventh phase g and eighth phase h, the signal output terminal OUTPUT of the shift register unit outputs a non-scanning signal (low voltage level). In each of the fourth phase d, the fifth phase e and the sixth phase f, the signal output terminal OUTPUT of the shift register unit outputs a scanning signal (high voltage level) to activate a gate line connected to the signal output terminal OUTPUT, so that when the OLED display performs displaying, the TFT connected to the activated gate line in the pixel circuit thereof maintains a turned-on state for a long time to realize self-luminous displaying.

In addition, the shift register unit capable of keeping the gate line in a enabled state for a long time (also referred to as a normally-on-type shift register unit) as provided by the embodiments of the present disclosure is composed by only eight thin film transistors and three storage capacitors. Therefore, the circuit structure is simple, which facilities the narrow frame design.

The embodiments of the present disclosure provide a display device, comprising any of the gate driving circuit described above. The display device may be an OLED display device, for example, any product or component having a display function such as a television, a digital photo frame, a mobile phone or a tablet computer. The gate driving circuit in the display device has the same structure and advantageous effects as those of the gate driving circuit provided in the foregoing embodiments, and since the structure and the advantageous effects of the gate driving circuit have been described in detail in the foregoing embodiments, no more details are repeated here.

The embodiments of the present disclosure provide a driving method for driving any of the shift register unit described above, and the driving method may include the following six operation phases.

In a first operating phase, a trigger signal is inputted to the signal input terminal, the signal input module is enabled under control of the first clock control terminal to transmit the trigger signal to the control node, so that the pull-down module is disabled and the first pull-up control module is disabled, the pull-down module stores a voltage level of the control node, the second pull-up control module does not output an enabling signal to the pull-up module under control of the second clock control terminal, the pull-up module is disabled, the signal output terminal outputs a non-scanning signal. The first operating phase may be the third phase c as shown in FIG. 3.

In a second operating phase, a trigger signal is inputted to the signal input terminal, the signal input module is disabled under control of the first clock control terminal, the pull-down module maintains a voltage level of the control node, so that the pull-down module is disabled and the first pull-up control module is disabled, the second pull-up control module outputs an enabling signal to the pull-up module under control of the second clock control terminal, so that the pull-up module is enabled, the signal output terminal outputs a scanning signal. The second operating phase may be the fourth phase d as shown in FIG. 3.

In a third operating phase, a trigger signal is inputted to the signal input terminal, the signal input module is enabled under control of the first clock control terminal to transmit the scanning signal to the control node, so that the pull-down module is disabled and the first pull-up control module is disabled, the pull-down module stores a voltage level of the control node, the output terminal of the second pull-up control module continues to output an enabling signal under control of the second clock control terminal, so that the pull-up module maintains being enabled, the signal output terminal outputs a scanning signal. The third operating phase may be the fifth phase e as shown in FIG. 3.

In a fourth operating phase, a non-trigger signal is inputted to the signal input terminal, the signal input module is disabled under control of the first clock control terminal, the pull-down module maintains a voltage level of the control node, so that the pull-down module is disabled and the first pull-up control module is disabled, the second pull-up control module outputs an enabling signal to the pull-up module under control of the second clock control terminal, so that the pull-up module is enabled, the signal output terminal outputs a scanning signal. The fourth operation phase may be the sixth phase f as shown in FIG. 3.

In a fifth operation phase, a non-trigger signal is inputted to the signal input terminal, the signal input module is enabled under control of the first clock control terminal to transmit the non-trigger signal to the control node, so that the pull-down module is enabled and the first pull-up control module is enabled, the pull-down module stores a voltage level of the control node, the first pull-up control module outputs a disabling signal to the pull-up module, the second pull-up control module does not output an enabling signal to the pull-up module under control of the second clock control terminal, the pull-up module is disabled, the signal output terminal outputs a non-scanning signal. The fifth operation phase may be the seventh phase g as shown in FIG. 3. In addition, the fifth operation phase may also be the first phase a as shown in FIG. 3.

In a sixth operation phase, a non-trigger signal is inputted to the signal input terminal, the signal input module is disabled under control of the first clock control terminal, the pull-down module maintains a voltage level of the control node, so that the pull-down module is enabled and the first pull-up control module is enabled, the first pull-up control module outputs a disabling signal to the pull-up module, the second pull-up control module does not output an enabling signal to the pull-up module under control of the second clock control terminal, the pull-up module is disabled, the signal output terminal outputs a non-scanning signal. The sixth operating phase may be the eighth phase h as shown in FIG. 3. In addition, the sixth operating phase may also be the second phase b as shown in FIG. 3.

As for the operation of the driving method according to the embodiments of the present disclosure, reference may be made to the detailed descriptions provided above with reference to FIG. 3 and FIGS. 5 to 12, no more details are repeated here.

In the driving method according to the embodiments of the present disclosure, in each of the first phase a, the second phase b, the third phase c, the seventh phase g and eighth phase h, the signal output terminal OUTPUT of the shift register unit outputs a non-scanning signal (low voltage level). In each of the fourth phase d, the fifth phase e and the sixth phase f, the signal output terminal OUTPUT of the shift register unit outputs a scanning signal (high voltage level) to activate a gate line connected to the signal output terminal OUTPUT, so that when the OLED display performs displaying, the TFT connected to the activated gate line in the pixel circuit thereof maintains a turned-on state for a long time to realize self-luminous displaying.

In addition, the shift register unit capable of keeping the gate line in a enabled state for a long time (also referred to as a normally-on-type shift register unit) as provided by the embodiments of the present disclosure is composed by only eight thin film transistors and three storage capacitors. Therefore, the circuit structure is simple, which facilities the narrow frame design.

As will be appreciated by those of ordinary skill in the art: all or part of the steps of the above method embodiments may be completed by instructing relevant hardware through programs, these programs may be stored in a computer readable storage medium, the steps included in the above method embodiments will be executed when the programs are executed; the aforesaid storage medium includes various mediums capable of storing program codes like a mobile storage device, such as a Read Only Memory (ROM), a Ramdom Access Memory (RAM), a magnetic disk, or an optical disk.

The above described are merely specific implementations of the present application, however, the protection scope of the present application is limited thereto, modifications or replacements that are easily conceivable for those skilled in the art within the technique range disclosed in the present application should all fall into the protection scope of the present application. Therefore, the protection scope of the present application should be based on what is claimed in the claims.

The present application claims priority right of Chinese Patent Application No. 201510266842.6 filed on May 22, 2015 and entitled of "SHIFT REGISTER UNIT AND CONTROL METHOD THEREOF, GATE DRIVING CIRCUIT, AND DISPLAY DEVICE", the disclosure of which is incorporated in entirety herein by reference as a portion of the present disclosure.

What is claimed is:

1. A shift register unit, comprising a signal input module, a pull-down module, a pull-up module, a first pull-up control module and a second pull-up control module;

the signal input module being connected to a signal input terminal, a first clock signal terminal and a control node, respectively, and configured to be enabled under control of the first clock signal terminal so as to output a signal of the signal input terminal to the control node;

the pull-down module being connected to the control node, a first voltage terminal and a signal output terminal, respectively, and configured to output a signal of the first voltage terminal to the signal output terminal under control of the control node, store a voltage level of the control node in a state where the signal input module is enabled, and maintain the voltage level of the control node in a state where the signal input module is disabled;

the first pull-up control module being connected to the control node, the pull-up module and a second voltage terminal, respectively, and configured to output a signal of the second voltage terminal, as a disabling signal, to the pull-up module under control of the control node;

the second pull-up control module being connected to the control node, the pull-up module, the first clock signal terminal, the first voltage terminal and a second clock signal terminal, respectively, and configured to output the signal of the first voltage terminal, as an enabling signal, to the pull-up module under control of the control node, the first clock signal terminal and the second clock signal terminal; and the pull-up module being further connected to the signal output terminal and the second voltage terminal, and configured to be in a disabled state under control of the disabling signal outputted by the first pull-up control module or be in an enabled state under control of the enabling signal outputted by the second pull-up control module so as to output the signal of the second voltage terminal to the signal output terminal.

2. The shift register unit according to claim 1, wherein the first pull-up control module outputs the disabling signal during a first time period, the second pull-up control module outputs the enabling signal during a second time period, the first time period and the second time period do not overlap with each other, the pull-up module is in the disabled state during the first time period, whereas the pull-up module is in the enabled state and outputs the signal of the second voltage terminal to the signal output terminal during the second time period.

3. The shift register unit according to claim 2, wherein the second pull-up control module comprises a fifth transistor, a sixth transistor, a seventh transistor, an eighth transistor, as well as a second capacitor and a third capacitor;

a gate of the fifth transistor being connected to the control node, a first electrode of the fifth transistor being connected to the first clock signal terminal, and a second electrode of the fifth transistor being connected to a first electrode of the sixth transistor;

a gate of the sixth transistor being connected to the first dock signal terminal, and a second electrode of the sixth transistor being connected to the first voltage terminal;

a gate of the seventh transistor being connected to the second dock signal terminal, a first electrode of the seventh transistor being connected to the pull-up module, and a second electrode of the seventh transistor being connected to a first electrode of the eighth transistor;

a gate of the eighth transistor being connected to the first electrode of the sixth transistor, and a second electrode of the eighth transistor being connected to the first voltage terminal;

a first terminal of the second capacitor being connected to the second clock signal terminal, and a second terminal of the second capacitor being connected to the first electrode of the seventh transistor;

a first terminal of the third capacitor being connected to the first electrode of the sixth transistor, and a second terminal of the third capacitor being connected to the gate of the seventh transistor.

4. A gate driving circuit comprising shift register units according to claim 2 and cascaded in at least two stages, wherein the signal input terminal of the shift register unit in a first stage is connected to a trigger signal terminal;

except the shift register unit in the first stage, the signal input terminal of the shift register unit in each of the rest stages is connected to the signal output terminal of the shift register unit in an adjacently upper stage.

5. A driving method for driving the shift register unit according to claim 2, comprising that:

a trigger signal is inputted to the signal input terminal, the signal input module is enabled under control of the first clock control terminal to transmit the trigger signal to the control node, so that the pull-down module is disabled and the first pull-up control module is disabled, the pull-down module stores the voltage level of the control node, the second pull-up control module does not output the enabling signal to the pull-up module under control of the second clock control terminal, the pull-up module is disabled, the signal output terminal outputs a non-scanning signal;

the trigger signal is inputted to the signal input terminal, the signal input module is disabled under control of the first clock control terminal, the pull-down module maintains the voltage level of the control node, so that the pull-down module is disabled and the first pull-up control module is disabled, the second pull-up control module outputs the enabling signal to the pull-up module under control of the second clock control terminal, so that the pull-up module is enabled, the signal output terminal outputs a scanning signal;

the trigger signal is inputted to the signal input terminal, the signal input module is enabled under control of the first dock control terminal to transmit the scanning signal to the control node, so that the pull-down module is disabled and the first pull-up control module is disabled, the pull-down module stores the voltage level of the control node, the output terminal of the second pull-up control module continues to output the enabling signal under control of the second dock control terminal, so that the pull-up module maintains being enabled, the signal output terminal outputs the scanning signal;

a non-trigger signal is inputted to the signal input terminal, the signal input module is disabled under control of the first clock control terminal, the pull-down module maintains a voltage level of the control node, so that the pull-down module is disabled and the first pull-up control module is disabled, the second pull-up control module outputs the enabling signal to the pull-up module under control of the second dock control terminal, so that the pull-up module is enabled, the signal output terminal outputs the scanning signal;

the non-trigger signal is inputted to the signal input terminal, the signal input module is enabled under control of the first dock control terminal to transmit the non-trigger signal to the control node, so that the pull-down module is enabled and the first pull-up control module is enabled, the pull-down module stores the voltage level of the control node, the first pull-up control module outputs the disabling signal to the pull-up module, the second pull-up control module does not output the enabling signal to the pull-up module under control of the second clock control terminal, the pull-up module is disabled, the signal output terminal outputs the non-scanning signal; and the non-trigger signal is inputted to the signal input terminal, the signal input module is disabled under control of the first dock control terminal, the pull-down module maintains the voltage level of the control node, so that the pull-down module is enabled and the first pull-up control module is enabled, the first pull-up control module outputs the disabling signal to the pull-up module, the second pull-up control module does not output the enabling signal to the pull-up module under control of the second clock control terminal, the pull-up module is disabled, the signal output terminal outputs the non-scanning signal.

6. The shift register unit according to claim 1, wherein the first pull-up control module is connected to a first control terminal of the pull-up module, the second pull-up control module is connected to a second control terminal of the pull-up module, the first control terminal and the second control terminal are the same or different.

7. The shift register unit according to claim 6, wherein the second pull-up control module comprises a fifth transistor, a sixth transistor, a seventh transistor, an eighth transistor, as well as a second capacitor and a third capacitor;

a gate of the fifth transistor being connected to the control node, a first electrode of the fifth transistor being connected to the first clock signal terminal, and a second electrode of the fifth transistor being connected to a first electrode of the sixth transistor;

a gate of the sixth transistor being connected to the first clock signal terminal, and a second electrode of the sixth transistor being connected to the first voltage terminal;

a gate of the seventh transistor being connected to the second clock signal terminal, a first electrode of the seventh transistor being connected to the pull-up module, and a second electrode of the seventh transistor being connected to a first electrode of the eighth transistor;

a gate of the eighth transistor being connected to the first electrode of the sixth transistor, and a second electrode of the eighth transistor being connected to the first voltage terminal;

a first terminal of the second capacitor being connected to the second clock signal terminal, and a second terminal of the second capacitor being connected to the first electrode of the seventh transistor;

a first terminal of the third capacitor being connected to the first electrode of the sixth transistor, and a second terminal of the third capacitor being connected to the gate of the seventh transistor.

8. A gate driving circuit comprising shift register units according to claim 6 and cascaded in at least two stages, wherein the signal input terminal of the shift register unit in a first stage is connected to a trigger signal terminal;

except the shift register unit in the first stage, the signal input terminal of the shift register unit in each of the rest stages is connected to the signal output terminal of the shift register unit in an adjacently upper stage.

9. The shift register unit according to claim 1, wherein the signal input module comprises:
- a first transistor, a gate of the first transistor being connected to the first clock signal terminal, a first electrode of the first transistor being connected to the signal input terminal, and a second electrode of the first transistor being connected to the control node.

10. The shift register unit according to claim 9, wherein the second pull-up control module comprises a fifth transistor, a sixth transistor, a seventh transistor, an eighth transistor, as well as a second capacitor and a third capacitor;
- a gate of the fifth transistor being connected to the control node, a first electrode of the fifth transistor being connected to the first clock signal terminal, and a second electrode of the fifth transistor being connected to a first electrode of the sixth transistor;
- a gate of the sixth transistor being connected to the first clock signal terminal, and a second electrode of the sixth transistor being connected to the first voltage terminal;
- a gate of the seventh transistor being connected to the second dock signal terminal, a first electrode of the seventh transistor being connected to the pull-up module, and a second electrode of the seventh transistor being connected to a first electrode of the eighth transistor;
- a gate of the eighth transistor being connected to the first electrode of the sixth transistor, and a second electrode of the eighth transistor being connected to the first voltage terminal;
- a first terminal of the second capacitor being connected to the second dock signal terminal, and a second terminal of the second capacitor being connected to the first electrode of the seventh transistor;
- a first terminal of the third capacitor being connected to the first electrode of the sixth transistor, and a second terminal of the third capacitor being connected to the gate of the seventh transistor.

11. The shift register unit according to claim 1, wherein the pull-down module comprises a second transistor and a first capacitor;
- a gate of the second transistor being connected to the control node, a first electrode of the second transistor being connected to the signal output terminal, and a second electrode of the second transistor being connected to the first voltage terminal;
- a first terminal of the first capacitor being connected to the gate of the second transistor, and a second terminal of the first capacitor being connected to the first electrode of the second transistor.

12. The shift register unit according to claim 11, wherein the second pull-up control module comprises a fifth transistor, a sixth transistor, a seventh transistor, an eighth transistor, as well as a second capacitor and a third capacitor;
- a gate of the fifth transistor being connected to the control node, a first electrode of the fifth transistor being connected to the first dock signal terminal, and a second electrode of the fifth transistor being connected to a first electrode of the sixth transistor;
- a gate of the sixth transistor being connected to the first dock signal terminal, and a second electrode of the sixth transistor being connected to the first voltage terminal;
- a gate of the seventh transistor being connected to the second dock signal terminal, a first electrode of the seventh transistor being connected to the pull-up module, and a second electrode of the seventh transistor being connected to a first electrode of the eighth transistor;
- a gate of the eighth transistor being connected to the first electrode of the sixth transistor, and a second electrode of the eighth transistor being connected to the first voltage terminal;
- a first terminal of the second capacitor being connected to the second clock signal terminal, and a second terminal of the second capacitor being connected to the first electrode of the seventh transistor;
- a first terminal of the third capacitor being connected to the first electrode of the sixth transistor, and a second terminal of the third capacitor being connected to the gate of the seventh transistor.

13. The shift register unit according to claim 1, wherein the first pull-up control module comprises:
- a third transistor, a gate of the third transistor being connected to the control node, a first electrode of the third transistor being connected to the pull-up module, and a second electrode of the third transistor being connected to the second voltage terminal.

14. The shift register unit according to claim 13, wherein the second pull-up control module comprises a fifth transistor, a sixth transistor, a seventh transistor, an eighth transistor, as well as a second capacitor and a third capacitor;
- a gate of the fifth transistor being connected to the control node, a first electrode of the fifth transistor being connected to the first clock signal terminal, and a second electrode of the fifth transistor being connected to a first electrode of the sixth transistor;
- a gate of the sixth transistor being connected to the first clock signal terminal, and a second electrode of the sixth transistor being connected to the first voltage terminal;
- a gate of the seventh transistor being connected to the second clock signal terminal, a first electrode of the seventh transistor being connected to the pull-up module, and a second electrode of the seventh transistor being connected to a first electrode of the eighth transistor;
- a gate of the eighth transistor being connected to the first electrode of the sixth transistor, and a second electrode of the eighth transistor being connected to the first voltage terminal;
- a first terminal of the second capacitor being connected to the second dock signal terminal, and a second terminal of the second capacitor being connected to the first electrode of the seventh transistor;
- a first terminal of the third capacitor being connected to the first electrode of the sixth transistor, and a second terminal of the third capacitor being connected to the gate of the seventh transistor.

15. The shift register unit according to claim 1, wherein the pull-up module comprises:
- a fourth transistor, a gate of the fourth transistor being connected to the first pull-up control module and the second pull-up control module, a first electrode of the fourth transistor being connected to the second voltage terminal, and a second electrode of the fourth transistor being connected to the signal output terminal.

16. The shift register unit according to claim 15, wherein the second pull-up control module comprises a fifth transistor, a sixth transistor, a seventh transistor, an eighth transistor, as well as a second capacitor and a third capacitor;
- a gate of the fifth transistor being connected to the control node, a first electrode of the fifth transistor being connected to the first dock signal terminal, and a second electrode of the fifth transistor being connected to a first electrode of the sixth transistor;

a gate of the sixth transistor being connected to the first dock signal terminal, and a second electrode of the sixth transistor being connected to the first voltage terminal;

a gate of the seventh transistor being connected to the second dock signal terminal, a first electrode of the seventh transistor being connected to the pull-up module, and a second electrode of the seventh transistor being connected to a first electrode of the eighth transistor;

a gate of the eighth transistor being connected to the first electrode of the sixth transistor, and a second electrode of the eighth transistor being connected to the first voltage terminal;

a first terminal of the second capacitor being connected to the second dock signal terminal, and a second terminal of the second capacitor being connected to the first electrode of the seventh transistor;

a first terminal of the third capacitor being connected to the first electrode of the sixth transistor, and a second terminal of the third capacitor being connected to the gate of the seventh transistor.

17. The shift register unit according to claim 1, wherein the second pull-up control module comprises a fifth transistor, a sixth transistor, a seventh transistor, an eighth transistor, as well as a second capacitor and a third capacitor;

a gate of the fifth transistor being connected to the control node, a first electrode of the fifth transistor being connected to the first clock signal terminal, and a second electrode of the fifth transistor being connected to a first electrode of the sixth transistor;

a gate of the sixth transistor being connected to the first clock signal terminal, and a second electrode of the sixth transistor being connected to the first voltage terminal;

a gate of the seventh transistor being connected to the second clock signal terminal, a first electrode of the seventh transistor being connected to the pull-up module, and a second electrode of the seventh transistor being connected to a first electrode of the eighth transistor;

a gate of the eighth transistor being connected to the first electrode of the sixth transistor, and a second electrode of the eighth transistor being connected to the first voltage terminal;

a first terminal of the second capacitor being connected to the second clock signal terminal, and a second terminal of the second capacitor being connected to the first electrode of the seventh transistor;

a first terminal of the third capacitor being connected to the first electrode of the sixth transistor, and a second terminal of the third capacitor being connected to the gate of the seventh transistor.

18. A gate driving circuit comprising shift register units according to claim 1 and cascaded in at least two stages, wherein the signal input terminal of the shift register unit in a first stage is connected to a trigger signal terminal;

except the shift register unit in the first stage, the signal input terminal of the shift register unit in each of the rest stages is connected to the signal output terminal of the shift register unit in an adjacently upper stage.

19. A display device, comprising the gate driving circuit according to claim 18.

20. A driving method for driving the shift register unit according to claim 1, comprising that:

a trigger signal is inputted to the signal input terminal, the signal input module is enabled under control of the first clock control terminal to transmit the trigger signal to the control node, so that the pull-down module is disabled and the first pull-up control module is disabled, the pull-down module stores the voltage level of the control node, the second pull-up control module does not output the enabling signal to the pull-up module under control of the second clock control terminal, the pull-up module is disabled, the signal output terminal outputs a non-scanning signal;

the trigger signal is inputted to the signal input terminal, the signal input module is disabled under control of the first clock control terminal, the pull-down module maintains the voltage level of the control node, so that the pull-down module is disabled and the first pull-up control module is disabled, the second pull-up control module outputs the enabling signal to the pull-up module under control of the second clock control terminal, so that the pull-up module is enabled, the signal output terminal outputs a scanning signal;

the trigger signal is inputted to the signal input terminal, the signal input module is enabled under control of the first clock control terminal to transmit the scanning signal to the control node, so that the pull-down module is disabled and the first pull-up control module is disabled, the pull-down module stores the voltage level of the control node, the output terminal of the second pull-up control module continues to output the enabling signal under control of the second clock control terminal, so that the pull-up module maintains being enabled, the signal output terminal outputs the scanning signal;

a non-trigger signal is inputted to the signal input terminal, the signal input module is disabled under control of the first clock control terminal, the pull-down module maintains the voltage level of the control node, so that the pull-down module is disabled and the first pull-up control module is disabled, the second pull-up control module outputs the enabling signal to the pull-up module under control of the second clock control terminal, so that the pull-up module is enabled, the signal output terminal outputs the scanning signal;

the non-trigger signal is inputted to the signal input terminal, the signal input module is enabled under control of the first clock control terminal to transmit the non-trigger signal to the control node, so that the pull-down module is enabled and the first pull-up control module is enabled, the pull-down module stores the voltage level of the control node, the first pull-up control module outputs the disabling signal to the pull-up module, the second pull-up control module does not output the enabling signal to the pull-up module under control of the second clock control terminal, the pull-up module is disabled, the signal output terminal outputs the non-scanning signal; and the non-trigger signal is inputted to the signal input terminal, the signal input module is disabled under control of the first clock control terminal, the pull-down module maintains the voltage level of the control node, so that the pull-down module is enabled and the first pull-up control module is enabled, the first pull-up control module outputs the disabling signal to the pull-up module, the second pull-up control module does not output the enabling signal to the pull-up module under control of the second clock control terminal, the pull-up module is disabled, the signal output terminal outputs the non-scanning signal.

\* \* \* \* \*